(12) United States Patent
Motoyama

(10) Patent No.: US 11,038,251 B2
(45) Date of Patent: Jun. 15, 2021

(54) RESONATOR

(71) Applicant: Soshin Electric Co., Ltd., Saku (JP)

(72) Inventor: Hiroto Motoyama, Ibaraki (JP)

(73) Assignee: Soshin Electric Co., Ltd., Saku (JP)

( * ) Notice: Subject to any disclaimer, the term of this patent is extended or adjusted under 35 U.S.C. 154(b) by 0 days.

(21) Appl. No.: 16/615,539

(22) PCT Filed: Sep. 27, 2017

(86) PCT No.: PCT/JP2017/034999
§ 371 (c)(1),
(2) Date: Nov. 21, 2019

(87) PCT Pub. No.: WO2018/216239
PCT Pub. Date: Nov. 29, 2018

(65) Prior Publication Data
US 2020/0176851 A1 Jun. 4, 2020

(30) Foreign Application Priority Data

May 22, 2017 (JP) .............................. JP2017-100815

(51) Int. Cl.
| | | |
|---|---|---|
| H03H 7/01 | (2006.01) | |
| H01P 7/10 | (2006.01) | |
| H01P 1/203 | (2006.01) | |
| H01P 7/04 | (2006.01) | |
| H01P 7/08 | (2006.01) | |
| H04B 10/079 | (2013.01) | |

(52) U.S. Cl.
CPC ............ *H01P 7/10* (2013.01); *H01P 1/20309* (2013.01); *H01P 7/04* (2013.01); *H01P 7/08* (2013.01); *H03H 7/01* (2013.01); *H04B 10/07953* (2013.01)

(58) Field of Classification Search
CPC ...... H01P 7/10; H01P 7/08; H01P 7/04; H01P 1/20309; H01P 1/203; H01P 1/20; H01P 1/201; H03H 7/0115; H03H 7/0123; H03H 7/01
USPC ....................... 333/219.1, 202, 204, 219, 175
See application file for complete search history.

(56) References Cited

U.S. PATENT DOCUMENTS

| | | |
|---|---|---|
| 5,945,892 A | 8/1999 | Kato et al. |
| 2006/0087388 A1 | 4/2006 | Kawai et al. |

(Continued)

FOREIGN PATENT DOCUMENTS

| | | |
|---|---|---|
| JP | H09-238040 A1 | 9/1997 |
| JP | 2002-009513 A1 | 1/2002 |

(Continued)

OTHER PUBLICATIONS

International Search Report and Written Opinion (Application No. PCT/JP2017/034999) dated Dec. 19, 2017.

(Continued)

*Primary Examiner* — Stephen E. Jones
(74) *Attorney, Agent, or Firm* — Burr & Brown, PLLC

(57) ABSTRACT

This resonator has a via electrode part that is formed in a dielectric substrate; a plurality of shielding conductors that are formed so as to surround the via electrode part in the dielectric substrate; and a strip line that is connected to the via electrode part in the dielectric substrate and opposed to at least the shielding conductors, wherein a first input/output terminal and a second input/output terminal are connected to one of the shielding conductors to which a short-circuit end of the via electrode part is connected.

6 Claims, 18 Drawing Sheets

(56) References Cited

U.S. PATENT DOCUMENTS

2010/0259344 A1  10/2010  Nosaka
2010/0265015 A1  10/2010  Hoeft et al.

FOREIGN PATENT DOCUMENTS

| JP | 4506903 | B2 | 7/2010 |
| JP | 2011-507312 | A1 | 3/2011 |
| JP | 4985999 | B2 | 7/2012 |
| JP | 2017-195565 | A1 | 10/2017 |

OTHER PUBLICATIONS

Taiwanese Office Action (Application No. 106133505) dated Nov. 26, 2018 (with English translation).

RESONATOR

TECHNICAL FIELD

The present invention relates to a resonator having a via hole formed in a dielectric, for example.

BACKGROUND ART

In order to suppress lowering of a Q-factor, there has conventionally been adopted a configuration whereby an electrode configured by a via hole (hereafter, called a via electrode) having a circular cross-sectional shape is formed in a dielectric substrate having a periphery in which a shielding conductor has been formed (refer to Japanese Laid-Open Patent Publication No. 2002-009513).

Moreover, there has conventionally been adopted a configuration whereby two ground electrodes and an input/output electrode are formed on a lower surface of a dielectric substrate, a plate-like inner electrode is formed in a dielectric, and, furthermore, via electrodes are respectively formed between the two ground electrodes and the inner electrode, and a via electrode is formed between the input/output electrode and the inner electrode, in the dielectric (refer to Japanese Patent No. 4506903).

Furthermore, there has conventionally been adopted a configuration whereby a ground conductor layer is formed solely on a lower surface of a dielectric substrate, and a strip line (an inductor configuring section) is formed, via a via electrode (a ground connection path), above this ground conductor layer (refer to Japanese Patent No. 4985999, for example).

SUMMARY OF INVENTION

Incidentally, by increasing the diameters of the via electrodes described in Japanese Laid-Open Patent Publication No. 2002-009513 and Japanese Patent No. 4506903, current density can be lowered, and an improvement in the Q-factor can be expected. However, if the diameter of the via electrode is increased, a distance between the via electrode and the shielding conductor decreases, and the Q-factor lowers, which is a problem. That is, the distance between the via electrode and the shielding conductor also relates to an optimal solution of the Q-factor, so must be considered in design of a resonator.

If the diameter of the via electrode is increased, then in the case where the resonators are multi-staged to configure a dielectric filter, an electric wall occurs between the resonators, leading to a deterioration in the Q-factor, hence a distance between neighboring resonators also must be considered. In the dielectric filter, disposition of an electrode pattern (a line) for power receiving or coupling adjustment is inevitably required, but in this case, the electrode pattern (the line) must be disposed between the via electrode and a shielding conductor on the side surface. This results in the electrode pattern being disposed while hindering spread of a magnetic field from the via electrode, and hence leads to deterioration of the Q-factor and generation of unnecessary coupling, which is a problem.

On the other hand, in a resonator described in Japanese Patent No. 4985999, a portion operating as a TEM wave resonator is limited to the strip line. In other words, the via electrode merely functions to connect the strip line and the ground conductor layer disposed in parallel to the strip line.

The present invention has been made in view of such problems, and has an object of providing a resonator that can achieve an improvement in the Q-factor without increasing a size of a via electrode section.

[1] A resonator according to the present invention includes: a via electrode section formed in a dielectric substrate; a plurality of shielding conductors formed in the dielectric substrate so as to surround the via electrode section; and a strip line connected to the via electrode section and facing at least the shielding conductor in the dielectric substrate, wherein a first input/output terminal and a second input/output terminal are connected to the shielding conductor to which a short-circuit end of the via electrode section is connected, among the plurality of shielding conductors.

As a result, by the first input/output terminal being supplied with a current in, for example, a positive direction, the current diffuses in the shielding conductor to which the short-circuit end of the via electrode section is connected (hereafter, written as a specific shielding conductor), and flows toward another shielding conductor. At that time, a displacement current flows also from the strip line toward the specific shielding conductor via the via electrode section (Faraday's law), and this displacement current also flows toward the other shielding conductor via the specific shielding conductor. That is, from an instant that the first input/output terminal has been supplied with the current in, for example, the positive direction, the current flows, while diffusing from the specific shielding conductor into the other shielding conductor. As a result, an improvement in the Q-factor can be achieved without increasing the size of the via electrode section. Note that in the present specification, when reference is made simply to "Q-factor", it has a meaning including both an unloaded Q-factor in a range of the resonator alone and a loaded Q-factor in a range including an external circuit.

[2] In the present invention, the plurality of shielding conductors may include: the first shielding conductor (the specific shielding conductor) formed on a first principal surface side of the dielectric substrate; the second shielding conductor formed on a second principal surface side of the dielectric substrate; a third shielding conductor formed on a first side surface side of the dielectric substrate; and a fourth shielding conductor formed on a second side surface side of the dielectric substrate, and the short-circuit end of the via electrode section, the first input/output terminal, and the second input/output terminal may be connected to the first shielding conductor (the specific shielding conductor).

As a result, by the first input/output terminal being supplied with a current in, for example, a positive direction, the current diffuses in the first shielding conductor to which the short-circuit end of the via electrode section is connected (the specific shielding conductor), and flows toward the third shielding conductor and the fourth shielding conductor. At that time, a displacement current flows also from the strip line toward the first shielding conductor via the via electrode section, and this displacement current also flows toward the third shielding conductor and the fourth shielding conductor via the first shielding conductor.

[3] In the present invention, the via electrode section may include a first via electrode section and a second via electrode section that are formed adjacently to each other, the first via electrode section may be configured from a plurality of first via electrodes, the second via electrode section may be configured from a plurality of second via electrodes, it may be that no other via electrode section exists between the first via electrode section and the second via electrode section, the plurality of first via electrodes may be arranged along an imaginary first curved line when viewed from above, and the plurality of second via electrodes may be arranged along an imaginary second curved line when viewed from above.

Because the plurality of first via electrodes and the plurality of second via electrodes can be arranged solely in a portion where the current concentrates, an amount of a metal material (for example, silver) forming the first via electrode and the second via electrode can be significantly reduced, and the number of the first via electrodes and the second via electrodes can be reduced, hence a reduction in time-to-manufacture and costs can be achieved.

[4] In the present invention, the first curved line and the second curved line may configure a part of an outline of a single ellipse or a part of an outline of a single track shape.

As a result, the first via electrode section and the second via electrode section are formed in parts of the outline of the single ellipse or in parts of the outline of the single track shape, that is, in each of end sections on a long axis of the ellipse or the track shape. This portion is also a portion where the current concentrates due to skin effect of a high frequency current. That is, the current flows in a concentrated manner in the first via electrode section and the second via electrode section. It therefore becomes unnecessary for another via electrode section to be disposed between the first via electrode section and the second via electrode section.

[5] In the present invention, the first via electrode section, together with the strip line, may configure a first $\lambda/4$ resonator, and the second via electrode section, together with the strip line, may configure a second $\lambda/4$ resonator.

As a result, currents of the same phase always flow in the first $\lambda/4$ resonator and the second $\lambda/4$ resonator. By the currents having the same phase, a state of an electromagnetic field being sparse is attained between the first via electrode section and the second via electrode section when viewed as the resonator alone, and, even if an electrode for coupling or routing is disposed between them, unnecessary coupling can be suppressed to the utmost. As a result, effects of prevention of deterioration of the Q-factor and suppression of variation, are exhibited.

[6] In the present invention, it is preferable that when an interval between the first via electrode section and the second via electrode section is represented as dv, and a length of the dielectric substrate along a longitudinal direction of the strip line is represented as La, dv/La≤0.25 is satisfied.

As a result, an unloaded Q-factor of 380 or more is obtained. More preferably, dv/La≤0.21, and even more preferably, dv/La is between 0.05 and 0.16 inclusive.

As described above, the resonator according to the present invention enables an improvement in the Q-factor to be achieved without increasing the size of the via electrode section.

The above-described object, features, and advantages may be easily understood from the following description of embodiments made with reference to the accompanying drawings.

DESCRIPTION OF EMBODIMENTS

Embodiment examples of a resonator according to the present invention will be described below with reference to FIGS. 1-18B.

Figure 1:
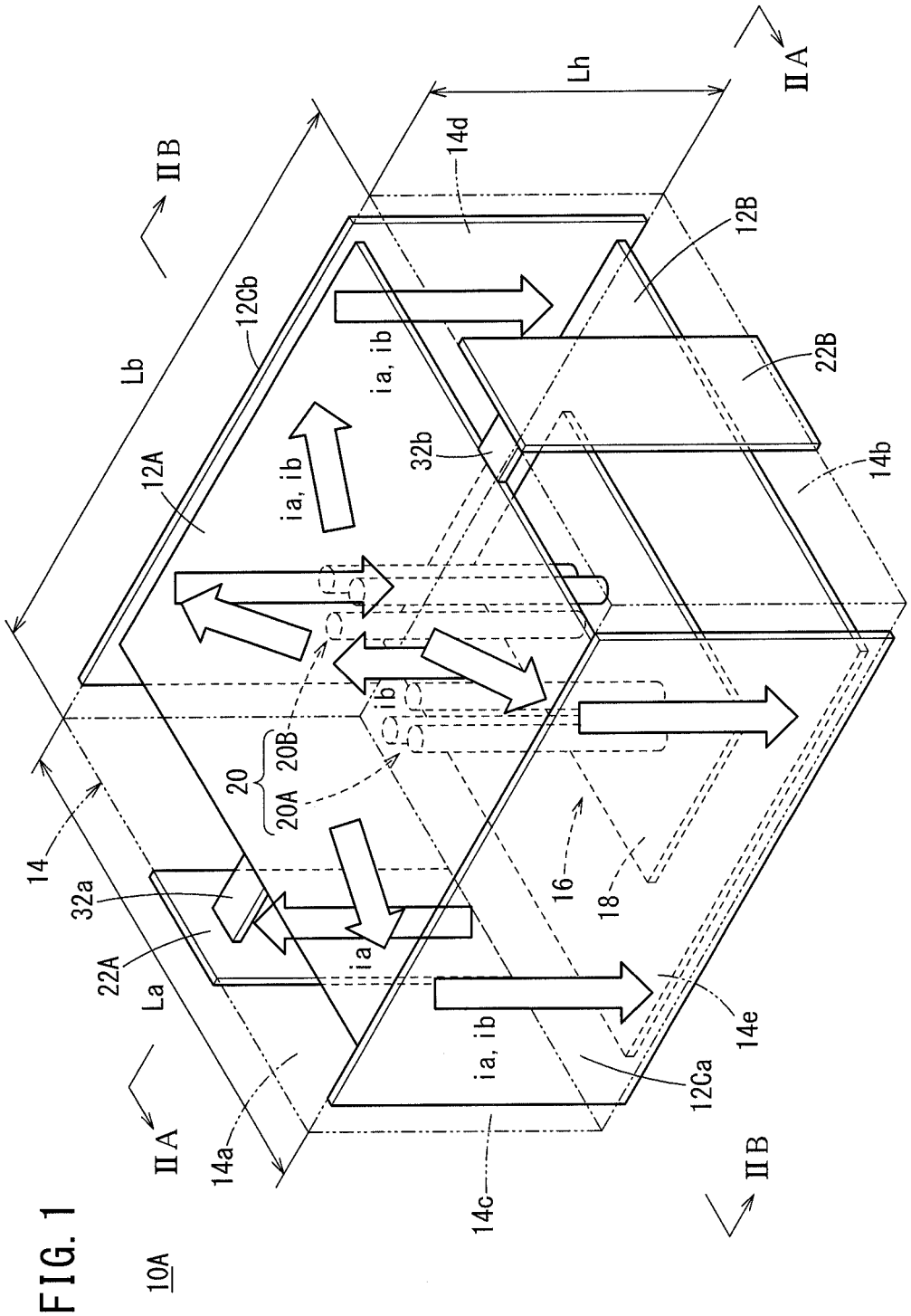
FIG. 1 is a see-through perspective view showing a resonator according to a first embodiment (a first resonator)
Figure 2A:
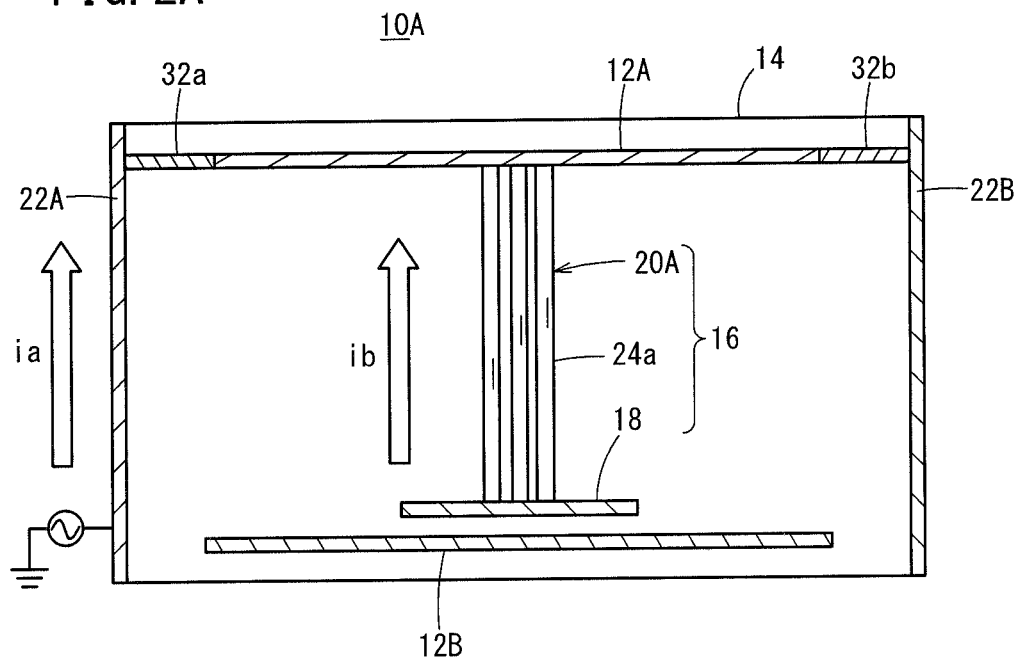
FIG. 2A is a cross-sectional view taken along the line IIA-IIA in FIG. 1.
Figure 2B:
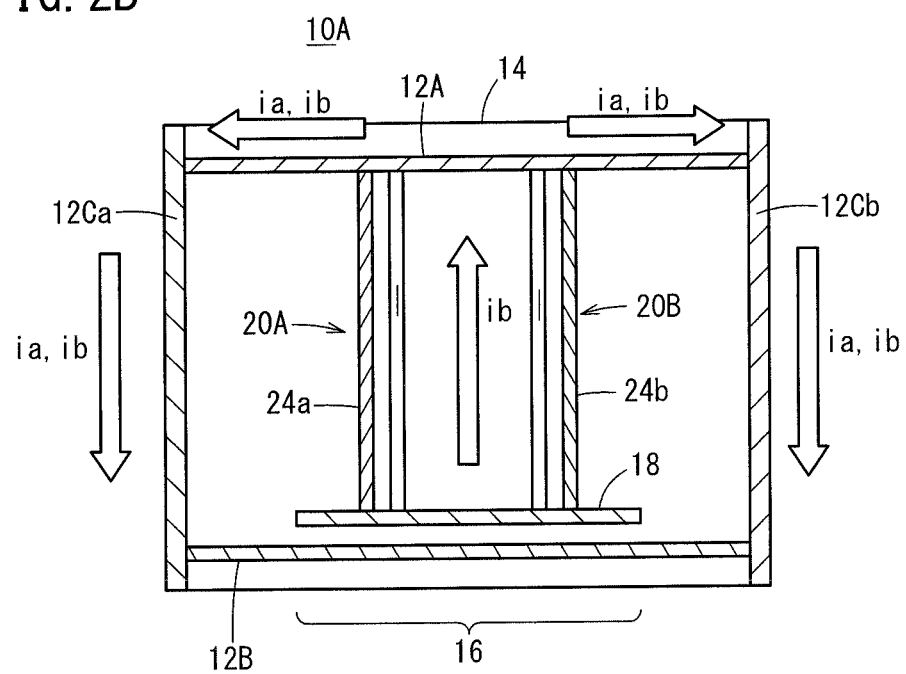
FIG. 2B is a cross-sectional view taken along the line IIB-IIB in FIG. 1.

First, as shown in FIGS. 1, 2A, and 2B, a resonator according to a first embodiment (hereafter, written as a first resonator 10A) includes: a dielectric substrate 14 in which an upper shielding conductor 12A and a lower shielding conductor 12B are respectively formed in at least its upper section and its lower section; and a single structure 16 formed within the dielectric substrate 14. The structure 16 includes: a strip line 18 facing the lower shielding conductor 12B; and a via electrode section 20 formed within the dielectric substrate 14, and formed adjacently from the strip line 18 toward the upper shielding conductor 12A. A planar shape of the strip line 18 is a rectangular shape, for example.

The dielectric substrate 14 is configured by laminating a plurality of dielectric layers, and, as shown in FIG. 1, for example, has a parallelepiped shape. Of the four side surfaces of the dielectric substrate 14, a first input/output terminal 22A is formed on a first side surface 14a, and a second input/output terminal 22B is formed on a second side surface 14b facing the first side surface 14a. In addition, a first side surface shielding conductor 12Ca is formed on a third side surface 14c, and a second side surface shielding conductor 12Cb is formed on a fourth side surface 14d facing the third side surface 14c.

The via electrode section 20 includes a first via electrode section 20A and a second via electrode section 20B. The first via electrode section 20A and the second via electrode section 20B are configured by a via hole formed in the dielectric substrate 14.

The first via electrode section 20A is configured from a plurality of first via electrodes of small diameter (hereafter, written as first small-diameter via electrodes 24a), and the second via electrode section 20B is configured from a plurality of second via electrodes of small diameter (hereafter, written as second small-diameter via electrodes 24b). No other via electrode section exists between the first via electrode section 20A and the second via electrode section 20B.

Figure 3:
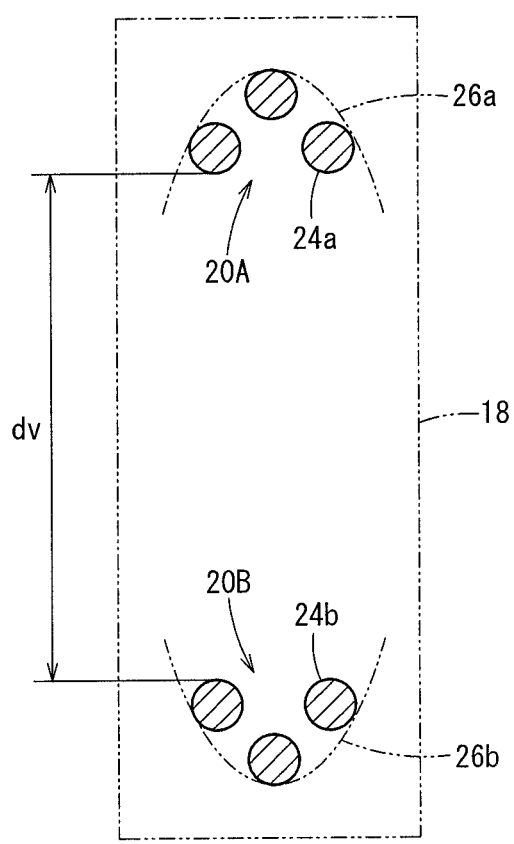
FIG. 3 is an explanatory diagram showing an arrangement state of a plurality of first small-diameter via electrodes configuring a first via electrode section and an arrangement state of a plurality of second small-diameter via electrodes configuring a second via electrode section.

Furthermore, in the first resonator 10A, as shown in FIG. 3, the plurality of first small-diameter via electrodes 24a are arranged along an imaginary first curved line 26a (a portion where a high frequency current concentrates) when viewed from above, and the plurality of second small-diameter via electrodes 24b are arranged along an imaginary second curved line 26b (a portion where a high frequency current concentrates) when viewed from above. The first curved line 26a and the second curved line 26b configure a part of an outline of a single ellipse or a part of an outline of a single track shape.

Now, a relationship between the first via electrode section 20A and the second via electrode section 20B, and the single ellipse will be described with reference to FIGS. 4A-6B.

Figure 4A:
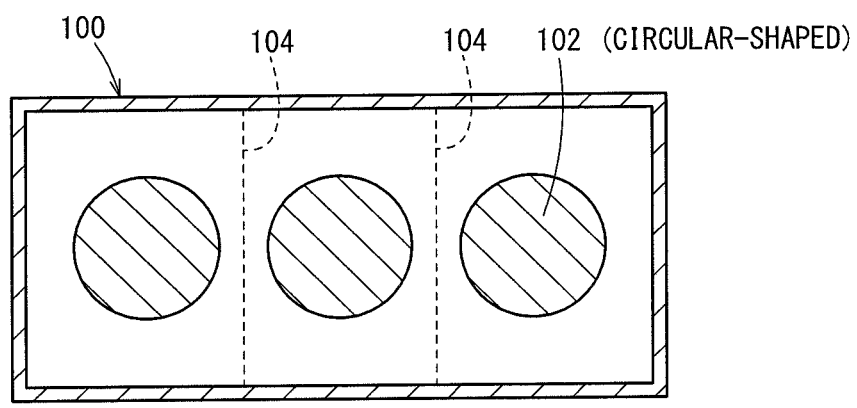
FIG. 4A is an explanatory diagram showing a problem in the case of a via electrode having a circular cross-sectional shape.

As shown in FIG. 4A, in a general resonator 100, if a diameter of a via electrode 102 having a circular cross-sectional shape is increased, then in the case where the resonators 100 are multi-staged to configure a dielectric filter, an electric wall 104 occurs between the resonators 100, leading to a deterioration in a Q-factor.

Figure 4B:
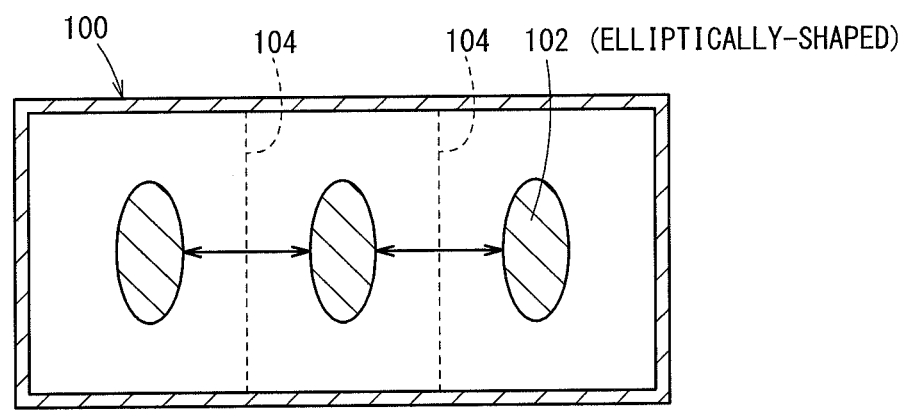
FIG. 4B is an explanatory diagram showing an advantage of a via electrode having an elliptical cross-sectional shape.

Accordingly, as shown in FIG. 4B, when a via electrode 102 having an elliptical cross-sectional shape has been adopted and the resonators 100 are multi-staged in a short axis direction to configure a dielectric filter, then, although the electric wall 104 occurs between the resonators 100, a distance between the via electrodes 102 becomes longer than that between the circular-shaped via electrodes 102 (refer to FIG. 4A), hence leading to an improvement in the Q-factor.

Figure 5A:
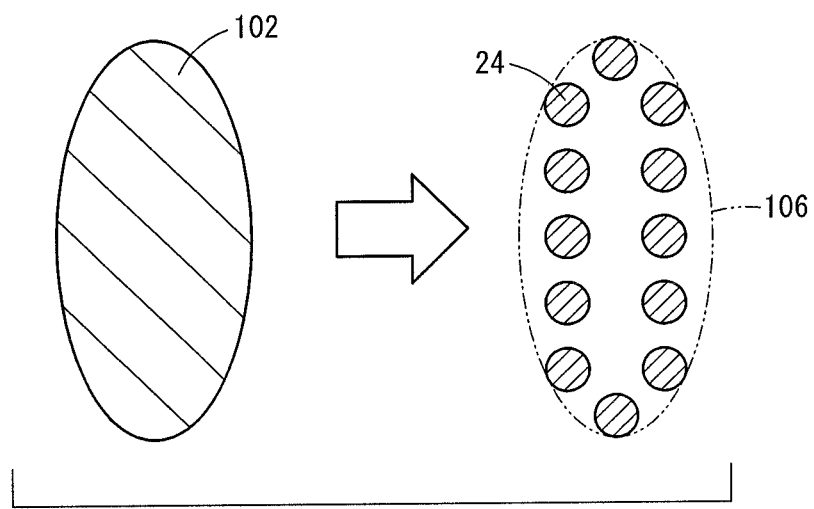
FIG. 5A is an explanatory diagram showing an example where an elliptically-shaped via electrode has been configured by a plurality of small-diameter via electrodes.

Furthermore, as shown in FIG. 5A, when the elliptically-shaped via electrode 102 is configured by a plurality of via electrodes of small diameter (hereafter, written as small-diameter via electrodes 24), an envelope 106 of its electromagnetic field behaves as if it is a via electrode of large diameter. Even if diameters of the individual small-diameter electrodes 24 vary at a constant rate, an effect on the envelope 106 (the via electrode of large diameter) is less than that rate, hence a reduction effect of variation can also be obtained.

Figure 5B:
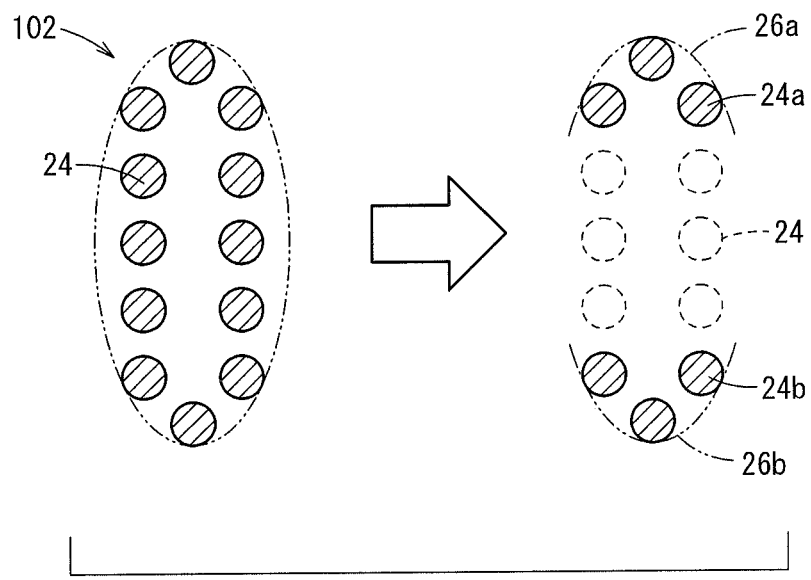
FIG. 5B is an explanatory diagram showing an example where, in the elliptically-shaped via electrode, the small-diameter via electrodes have been arranged solely in a portion where a current concentrates.

Incidentally, in the elliptically-shaped via electrode 102 shown in FIG. 5A, for example, a high frequency current concentrates in an end section of the ellipse, specifically, in both end sections where the curvature is large. Accordingly, as shown in FIG. 5B, among the plurality of small-diameter via electrodes 24 configuring the elliptically-shaped via electrode 102, the plurality of first small-diameter via electrodes 24a along the imaginary first curved line 26a where the curvature is large and the plurality of second small-diameter via electrodes 24b along the imaginary second curved line 26b where the curvature is large, positioned in both end sections of the elliptical shape, can be left, and the plurality of small-diameter via electrodes 24 positioned in a center of the elliptical shape can be removed.

That is, the plurality of first small-diameter via electrodes 24a configuring the first via electrode section 20A are arranged along the imaginary first curved line 26a, and the plurality of second small-diameter via electrodes 24b configuring the second via electrode section 20B are arranged along the imaginary second curved line 26b.

Figure 6A:
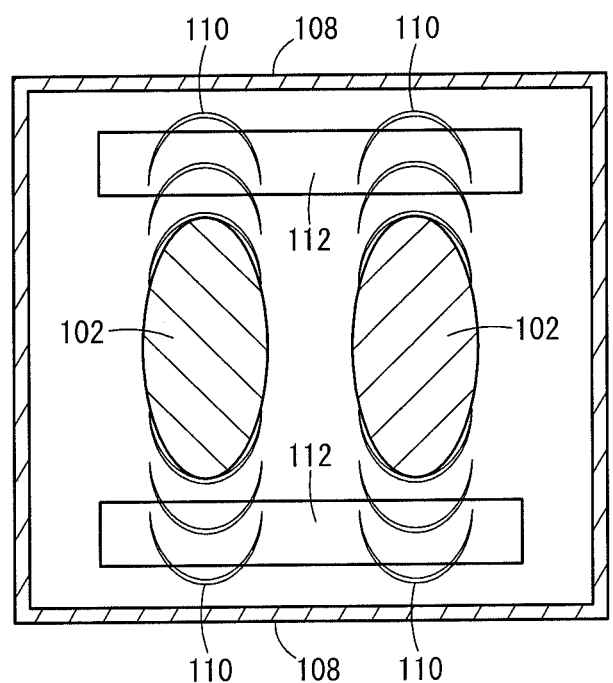
FIG. 6A is an explanatory diagram showing a problem of the elliptically-shaped via electrode.
Figure 6B:
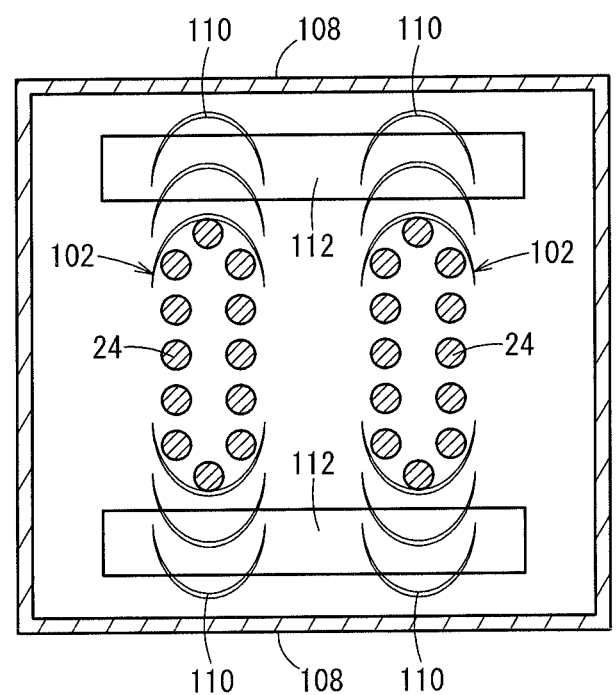
FIG. 6B is an explanatory diagram showing a problem in the case where the elliptically-shaped via electrode has been configured by the plurality of small-diameter via electrodes.

Moreover, in the case of the via electrode 102 having the elliptical cross-sectional shape as shown in FIG. 6A, or the elliptically-shaped via electrode 102 being configured by the plurality of small-diameter via electrodes 24 as shown in FIG. 6B, magnetic fields 110 spread from the elliptically-shaped via electrodes 102 toward respectively facing shielding conductors 108. However, in the case where the resonators 100 are multi-staged to configure a dielectric filter, although a pattern 112 (a line) for power receiving or coupling adjustment must be disposed, it has been unavoidable that the pattern 112 (the line) for power receiving or coupling adjustment is disposed between the elliptically-shaped via electrode 102 and the side surface shielding conductor 108, while hindering spread of the magnetic field 110 from the via electrode 102. This causes deterioration of the Q-factor or generation of unnecessary coupling.

Figure 7:
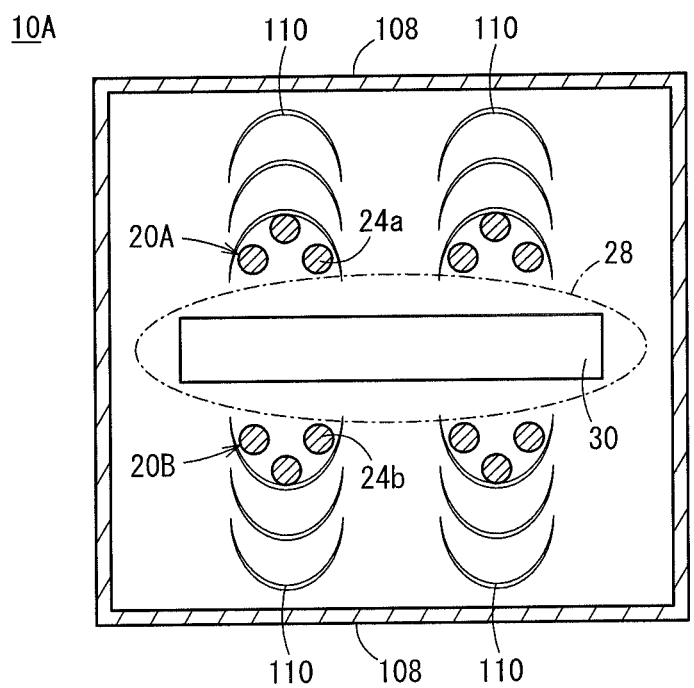
FIG. 7 is an explanatory diagram showing an advantage in the case where, in the elliptically-shaped via electrode, the small-diameter via electrodes have been arranged solely in the portion where the current concentrates.

On the other hand, in the first resonator 10A, as shown in FIG. 7, the plurality of first small-diameter via electrodes 24a configuring the first via electrode section 20A are arranged along the imaginary first curved line 26a (refer to FIG. 5B), and the plurality of second small-diameter via electrodes 24b configuring the second via electrode section 20B are arranged along the imaginary second curved line 26b (refer to FIG. 5B), so the magnetic fields 110 spread from the first via electrode section 20A and the second via electrode section 20B toward the respectively facing shielding conductors 108, and a region 28 where an electromagnetic field has become sparse is formed between the first via electrode section 20A and the second via electrode section 20B.

It therefore becomes possible for a pattern 30 (a line) for power receiving or coupling adjustment to be formed in the above-mentioned region 28 where the electromagnetic field has become sparse, that is, between the first via electrode section 20A and the second via electrode section 20B. As a result, deterioration of the Q-factor can be suppressed, and, what is more, unnecessary coupling can be suppressed.

Moreover, unlike the elliptically-shaped via electrode 102 shown in FIG. 6A or the plurality of small-diameter via electrodes 24 shown in FIG. 6B, the first small-diameter via electrodes 24a and the second small-diameter via electrodes 24b are arranged solely in a portion where the current concentrates as shown in FIG. 7, so an amount of a metal material (for example, silver) forming the first small-diameter via electrode 24a and the second small-diameter via electrode 24b can be significantly reduced, and the number of the first small-diameter via electrodes 24a and the second small-diameter via electrodes 24b can be reduced, hence a reduction in time-to-manufacture can be achieved.

Furthermore, in the first resonator 10A, as shown in FIGS. 1, 2A, and 2B, the first input/output terminal 22A and the second input/output terminal 22B are connected, via a first connection line 32a and a second connection line 32b, to the upper shielding conductor 12A to which respective short-circuit ends of the first via electrode section 20A and the second via electrode section 20B have been connected.

As a result, first, the via electrode section 20 of the first resonator 10A operates as a TEM wave resonator together with the first side surface shielding conductor 12Ca and the second side surface shielding conductor 12Cb. In other words, the via electrode section 20 operates as a TEM wave resonator with reference to the first side surface shielding conductor 12Ca and the second side surface shielding conductor 12Cb. The strip line 18 operates with a function of forming an open end capacitance. This clearly differs from a structure of a resonator described in Japanese Patent No. 4985999, that is, a structure of a resonator where a portion operating as a TEM wave resonator is limited to a strip line, and a via electrode section merely functions to connect the strip line and a ground conductor layer disposed in parallel to the strip line.

Specifically, as shown in FIGS. 1, 2A, and 2B, by the first input/output terminal 22A being supplied with a current ia in, for example, a positive direction, the current ia diffuses in the upper shielding conductor 12A to which the short-circuit end of the via electrode section 20 is connected, and flows toward the first side surface shielding conductor 12Ca and the second side surface shielding conductor 12Cb. At that time, a displacement current ib flows also from the strip line 18 toward the upper shielding conductor 12A via the via electrode section 20 (Faraday's law), and this displacement current ib also flows toward the first side surface shielding conductor 12Ca and the second side surface shielding conductor 12Cb via the upper shielding conductor 12A. That is, from an instant that the first input/output terminal 22A has been supplied with the current ia in, for example, the positive direction, the current (the current ia and the current ib) flows, while diffusing from the upper shielding conductor 12A into the first side surface shielding conductor 12Ca and the second side surface shielding conductor 12Cb. As a result, an improvement in the Q-factor can be achieved without increasing a size of the via electrode section 20.

Figure 8A:
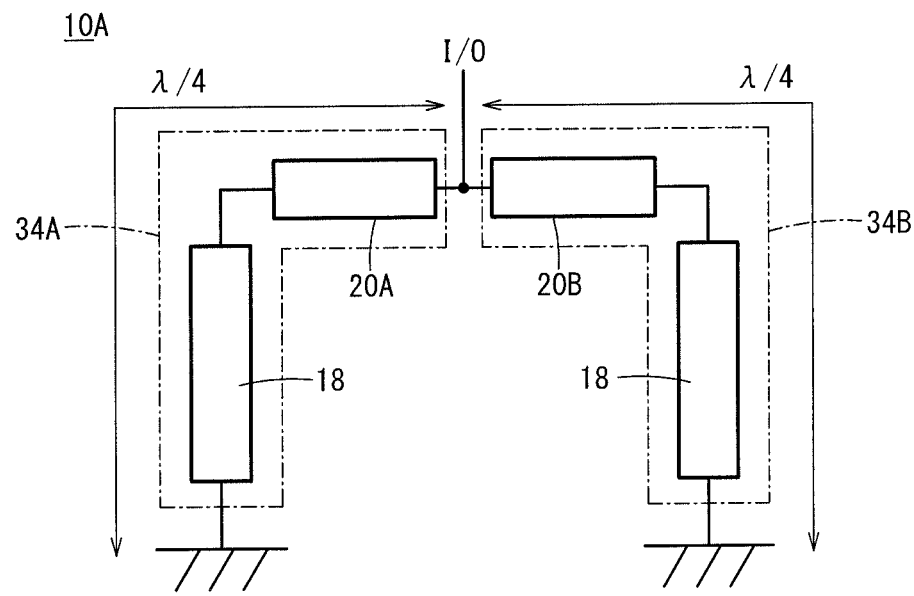
FIG. 8A is an equivalent circuit diagram showing the first resonator.
Figure 8B:
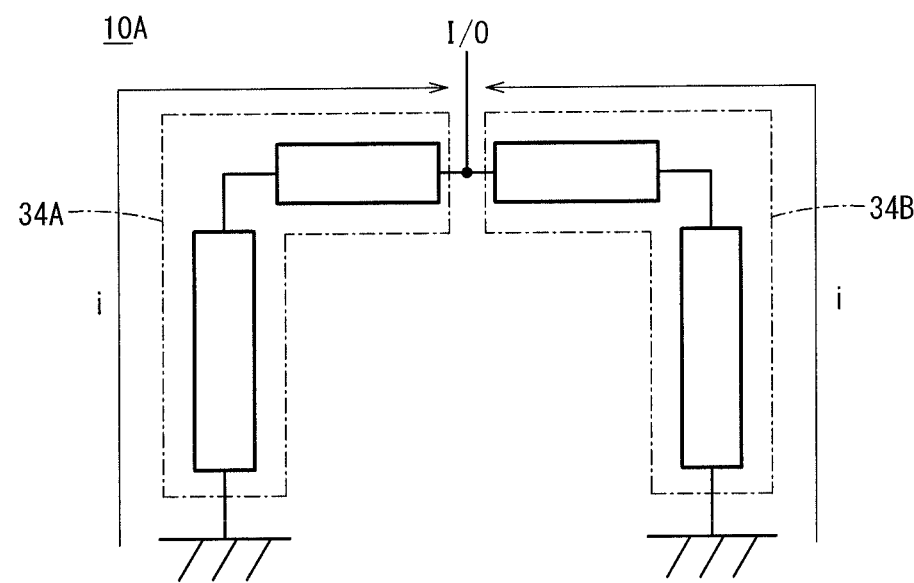
FIG. 8B is an explanatory diagram showing a flow of current of the first resonator.

Equivalent circuit diagrams of the first resonator 10A are shown in FIGS. 8A and 8B. As shown in FIG. 8A, a first λ/4 resonator 34A is configured from the strip line 18 to an input/output portion (I/O) of the first via electrode section 20A, and a second λ/4 resonator 34B is configured from the strip line 18 to an input/output portion (I/O) of the second via electrode section 20B. As a result, as shown in FIG. 8B, currents i of the same phase always flow in the first λ/4 resonator 34A and the second λ/4 resonator 34B. By the currents i having the same phase, a state of an electromagnetic field being sparse is attained between the first via electrode section 20A and the second via electrode section 20B when viewed as the first resonator 10A alone, and, even if an electrode for coupling or routing is disposed between them, unnecessary coupling can be suppressed to the utmost. As a result, deterioration of the Q-factor can be prevented, and variation in characteristics can be suppressed.

Next, a difference in frequency characteristics between a working example and a reference example will be described with reference to FIGS. 9 and 10.

Working Example

A configuration of a resonator according to the working example is similar to that of the first resonator 10A, as shown in FIGS. 1, 2A, and 2B.

Reference Example

Figure 9:
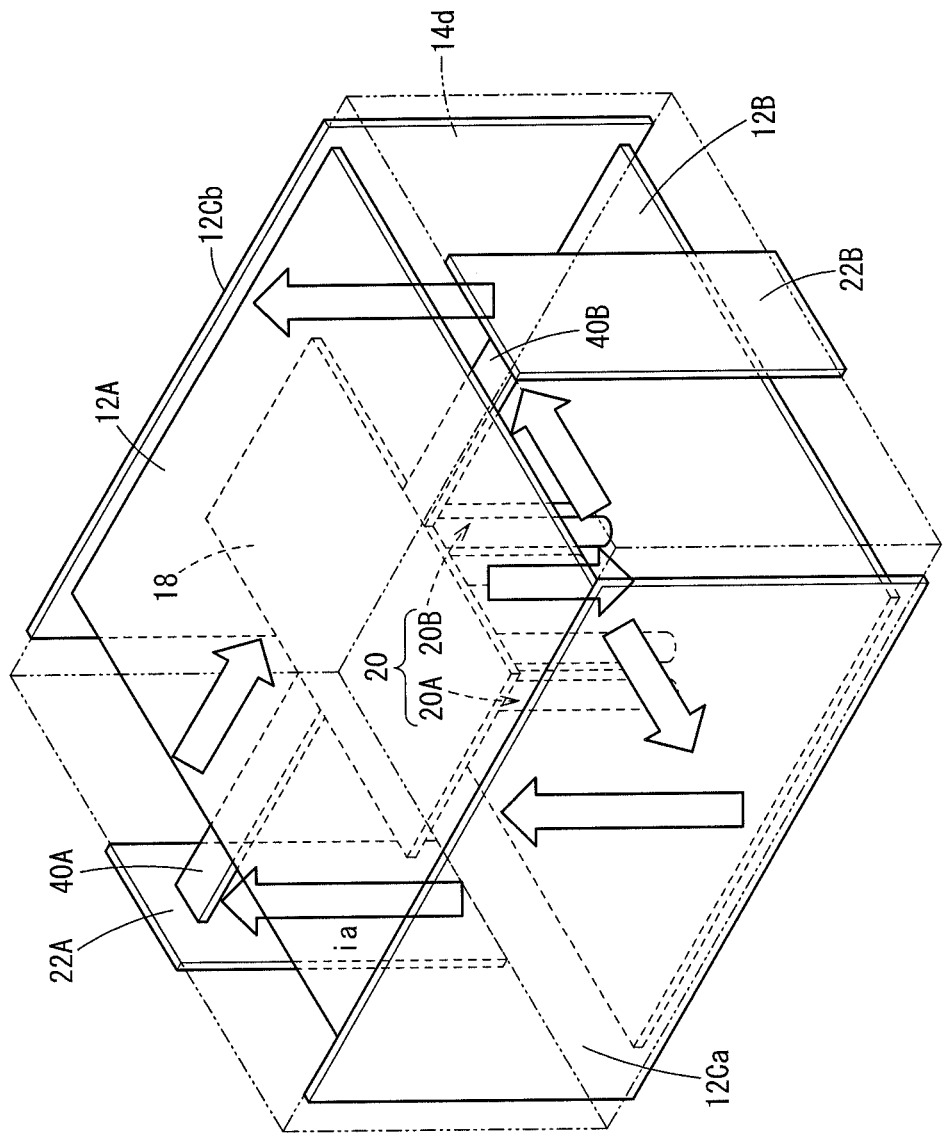
FIG. 9 is a see-through perspective view showing a resonator according to a reference example.

A configuration of a resonator according to the reference example is shown in FIG. 9. In FIG. 9, members corresponding to those of the first resonator 10A have been assigned with the same reference symbols as those assigned in the first resonator 10A, and descriptions thereof have been omitted.

As shown in FIG. 9, in the resonator according to the reference example, the strip line 18 faces the upper shielding conductor 12A. In addition, the resonator according to the reference example includes the first via electrode section 20A and the second via electrode section 20B that are formed adjacently to each other from the strip line 18 toward the lower shielding conductor 12B. Furthermore, the resonator according to the reference example includes, between the first via electrode section 20A and second via electrode section 20B, a first input/output line 40A which extends from the strip line 18 to the first input/output terminal 22A, and a second input/output line 40B which extends from the strip line 18 to the second input/output terminal 22B.

As a result, by the first input/output terminal 22A being supplied with the current is in, for example, the positive direction, the current ia flows into the strip line 18 via the first input/output line 40A, and, furthermore, flows into the lower shielding conductor 12B via the first via electrode section 20A and the second via electrode section 20B. The current ia that has flowed into the lower shielding conductor 12B diffuses in the lower shielding conductor 12B, and flows toward the first side surface shielding conductor 12Ca and the second side surface shielding conductor 12Cb.

Note that, regarding dimensions in the working example and the reference example, as shown in FIG. 1, a length La=2.5 mm, a width Lb=3.2 mm, and a height Lh=1.6 mm in the dielectric substrate 14, and an interval dv between the first via electrode section 20A and the second via electrode section 20B (refer to FIG. 3) is 0.5 mm. The length La of the dielectric substrate 14 is a length of the dielectric substrate 14 along a longitudinal direction of the strip line 18, and the width Lb of the dielectric substrate 14 is a length of the dielectric substrate 14 along a transverse direction of the strip line 18.

Figure 10:
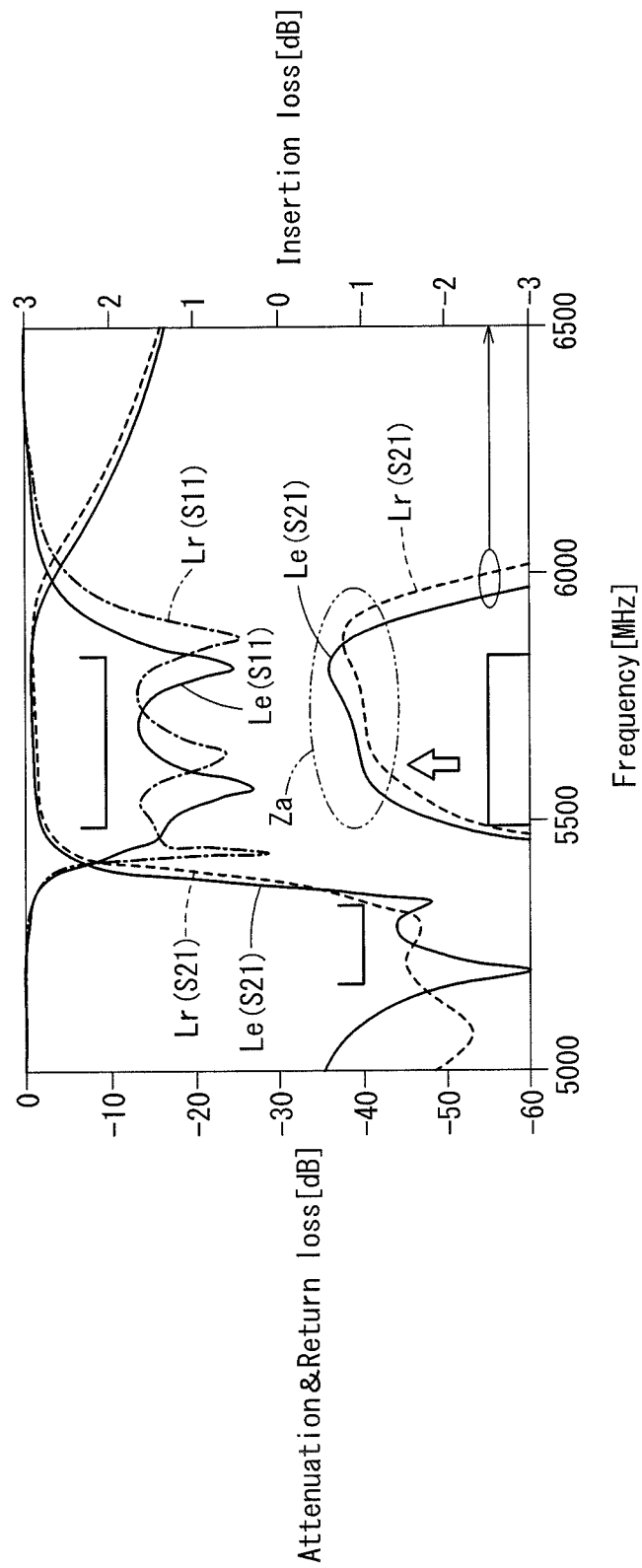
FIG. 10 is a diagram showing frequency characteristics of a resonator according to a working example and the resonator according to the reference example.

Frequency characteristics of the resonator according to the working example and the resonator according to the reference example are shown in FIG. 10. In FIG. 10, a solid line Le (S11) indicates S11 (an input reflection coefficient) of the working example, and a solid line Le (S21) indicates S21 (transmission characteristics) of the working example. Similarly, a broken line Lr (S11) indicates S11 (an input reflection coefficient) of the reference example, and a broken line Lr (S21) indicates S21 (transmission characteristics) of the reference example.

As may be understood also from a region Za indicated by an ellipse in the frequency characteristics of FIG. 10, a peak of resonance in the working example is found to be higher than in the reference example, and the working example is found to have a higher Q-factor than the reference example.

In this regard, it is thought that in the reference example, since the current ia from the first input/output terminal 22A once concentrates in the via electrode section 20 and flows from there into the first side surface shielding conductor 12Ca and the second side surface shielding conductor 12Cb via the lower shielding conductor 12B as shown in FIG. 9, a limit occurs in improvement of the Q-factor due to concentration of the current ia in the via electrode section 20.

In contrast, it is thought that in the working example, the displacement current ib flows in the via electrode section 20 simultaneously to the current ia being supplied to the first input/output terminal 22A as shown in FIG. 1, and that, as a result, the current ia undergoes diffusion to the upper shielding conductor 12A from the first input/output terminal 22A and the current ib undergoes diffusion to the upper shielding conductor 12A from the via electrode section 20 substantially simultaneously to flow into the first side surface shielding conductor 12Ca and the second side surface shielding conductor 12Cb, whereby a greater improvement in the Q-factor is achieved than in the reference example.

Next, an unloaded Q-factor (a Q-factor in a range of the resonator alone: a dimensionless number) with respect to the interval dv between the first via electrode section 20A and the second via electrode section 20B (hereafter, written as a via interval dv) is confirmed for working examples 1-6.

Working Example 1

Figure 11:
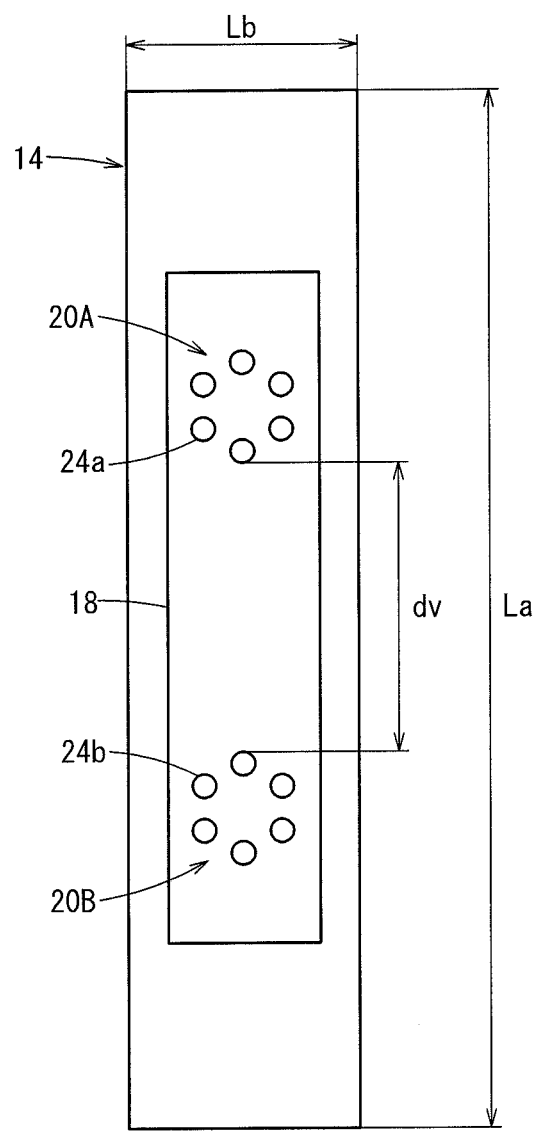
FIG. 11 is an explanatory diagram showing dimensions of a dielectric substrate, and an interval between the first via electrode section and the second via electrode section (a via interval), of working examples 1-6.

As shown in FIG. 11, dimensions of the dielectric substrate 14 are length La=4.5 mm, width Lb=1.0 mm, and height Lh=2.0 mm (not illustrated), and the via interval dv is 0.10 mm. The first via electrode section 20A has a form of six first small-diameter via electrodes 24a arranged circumferentially, and the second via electrode section 20B also has a form of six second small-diameter via electrodes 24b arranged circumferentially. Note that in FIG. 11, depiction of the upper shielding conductor 12A, the lower shielding conductor 12B, the first side surface shielding conductor 12Ca, the second side surface shielding conductor 12Cb, the first input/output terminal 22A, the second input/output terminal 22B, and so on, has been omitted.

Working Examples 2-6

Dimensions of the dielectric substrate 14 in working examples 2-6 are the same as in working example 1. The via intervals dv differ according to the working examples 2-6, and, specifically, are as follows.

Working Example 2: dv=0.30 mm
Working Example 3: dv=0.52 mm
Working Example 4: dv=0.72 mm
Working Example 5: dv=0.92 mm
Working Example 6: dv=1.12 mm (Evaluation Results)

Figure 12:
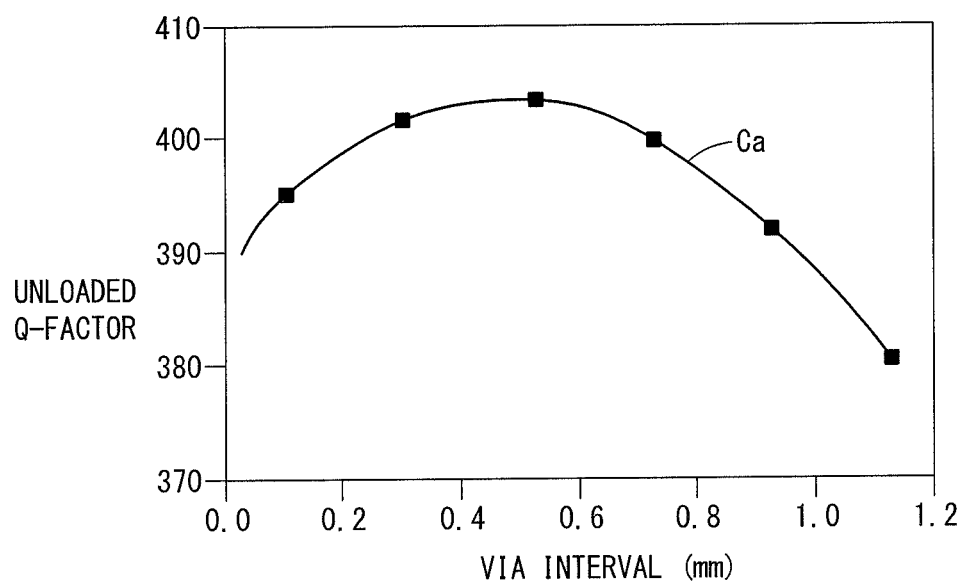
FIG. 12 is a graph showing an unloaded Q-factor of working examples 1-6.

Differences in the unloaded Q-factor among working examples 1-6 are shown in FIG. 12. Note that in FIG. 12, a characteristic curve Ca is a curve joining results of working examples 1-6. As may be understood from FIG. 12, the unloaded Q-factor is found to change according to the via interval dv, that is, a ratio (dv/La) of the via interval dv to the longitudinal length La of the dielectric substrate 14.

Moreover, as may be understood from the characteristic curve Ca, it is found that when the ratio (dv/La) is 1.13/4.5=0.25 or less, an unloaded Q-factor of 380 or more is obtained, when the ratio (dv/La) is 0.96/4.5=0.21 or less, an unloaded Q-factor of 390 or more is obtained, and when the ratio (dv/La) is between 0.24/4.5=0.05 and 0.70/4.5=0.16 inclusive, an unloaded Q-factor of 400 or more is obtained.

In the above-mentioned first resonator 10A, an example has been shown in which, as shown in FIG. 1, the via electrode section 20 is configured by the first via electrode section 20A and the second via electrode section 20B, and, furthermore, the first via electrode section 20A is configured by the plurality of first small-diameter via electrodes 24a, and the second via electrode section 20B is configured by the plurality of second small-diameter via electrodes 24b.

Figure 13:
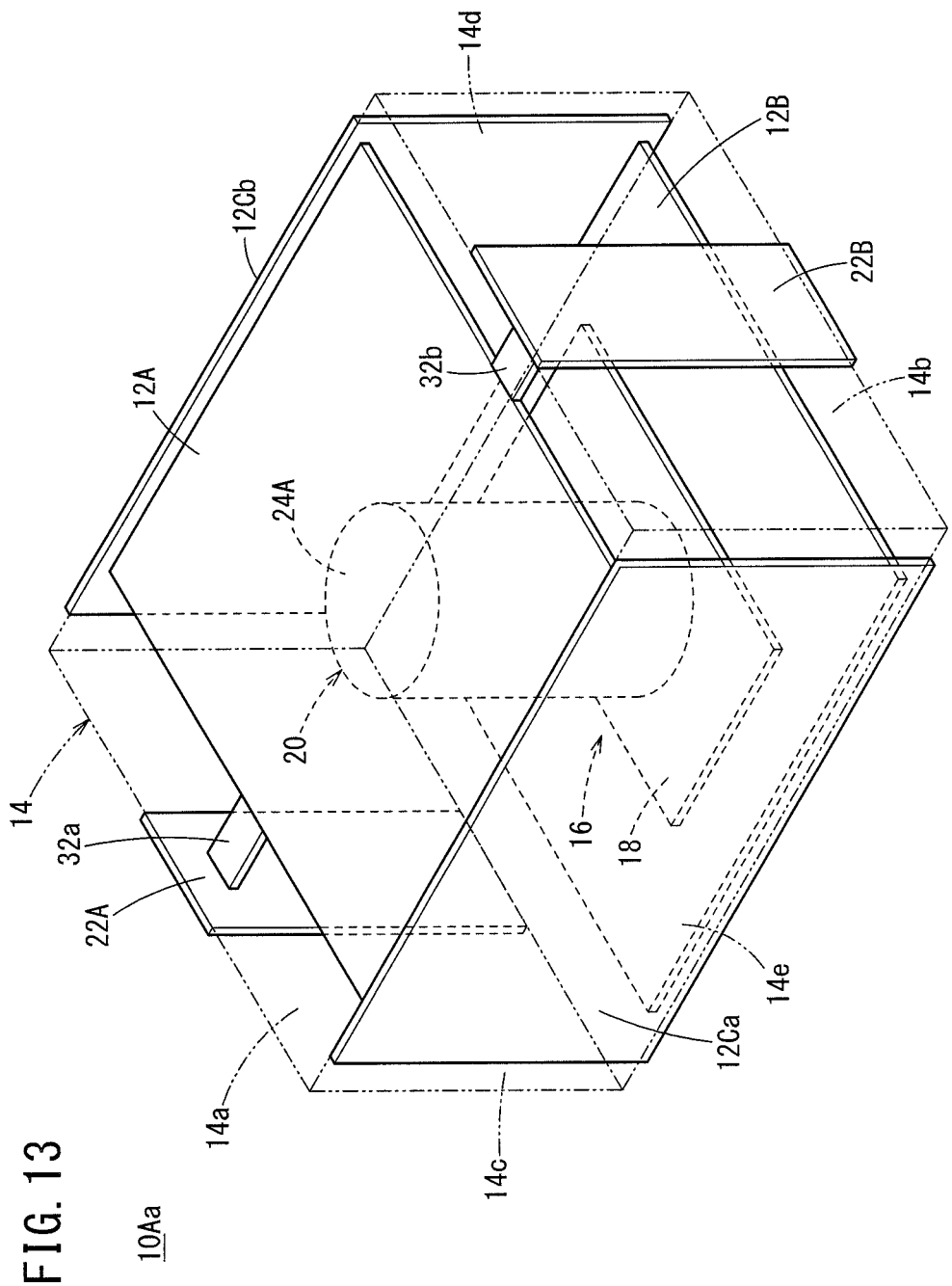
FIG. 13 is a see-through perspective view showing a resonator according to a first modified example of the first resonator.
Figure 14:
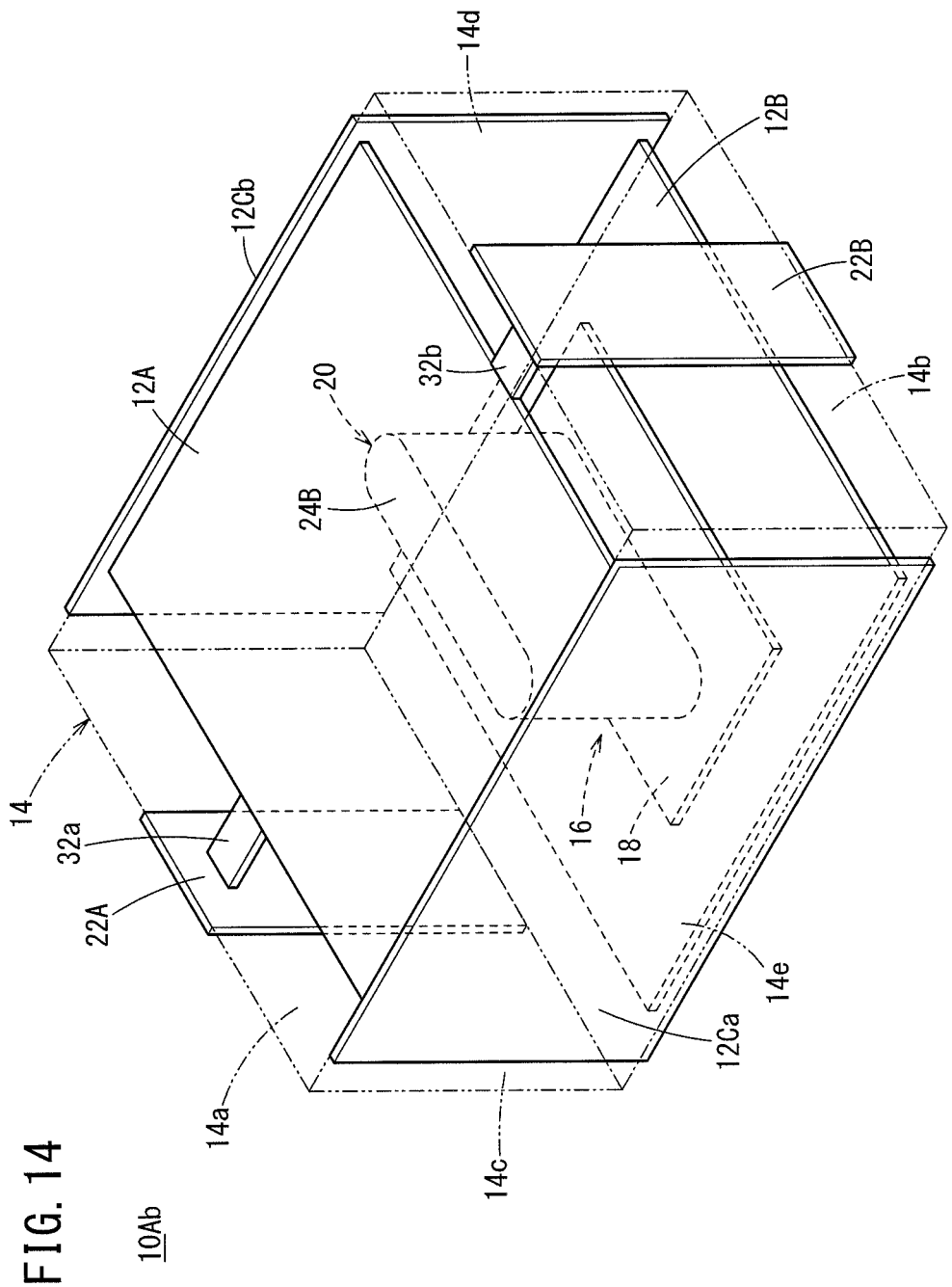
FIG. 14 is a see-through perspective view showing a resonator according to a second modified example of the first resonator.

In addition, the via electrode section 20 may be configured by a single via electrode 24A whose cross section has been configured in a circular shape or an elliptical shape, as in a resonator 10Aa according to a first modified example shown in FIG. 13. Alternatively, the via electrode section 20 may be configured by a single via electrode 24B whose cross section has been configured in a track shape, as in a resonator 10Ab according to a second modified example shown in FIG. 14.

Next, a resonator according to a second embodiment (hereafter, written as a second resonator 10B) will be described with reference to FIGS. 15-16B.

Figure 15:
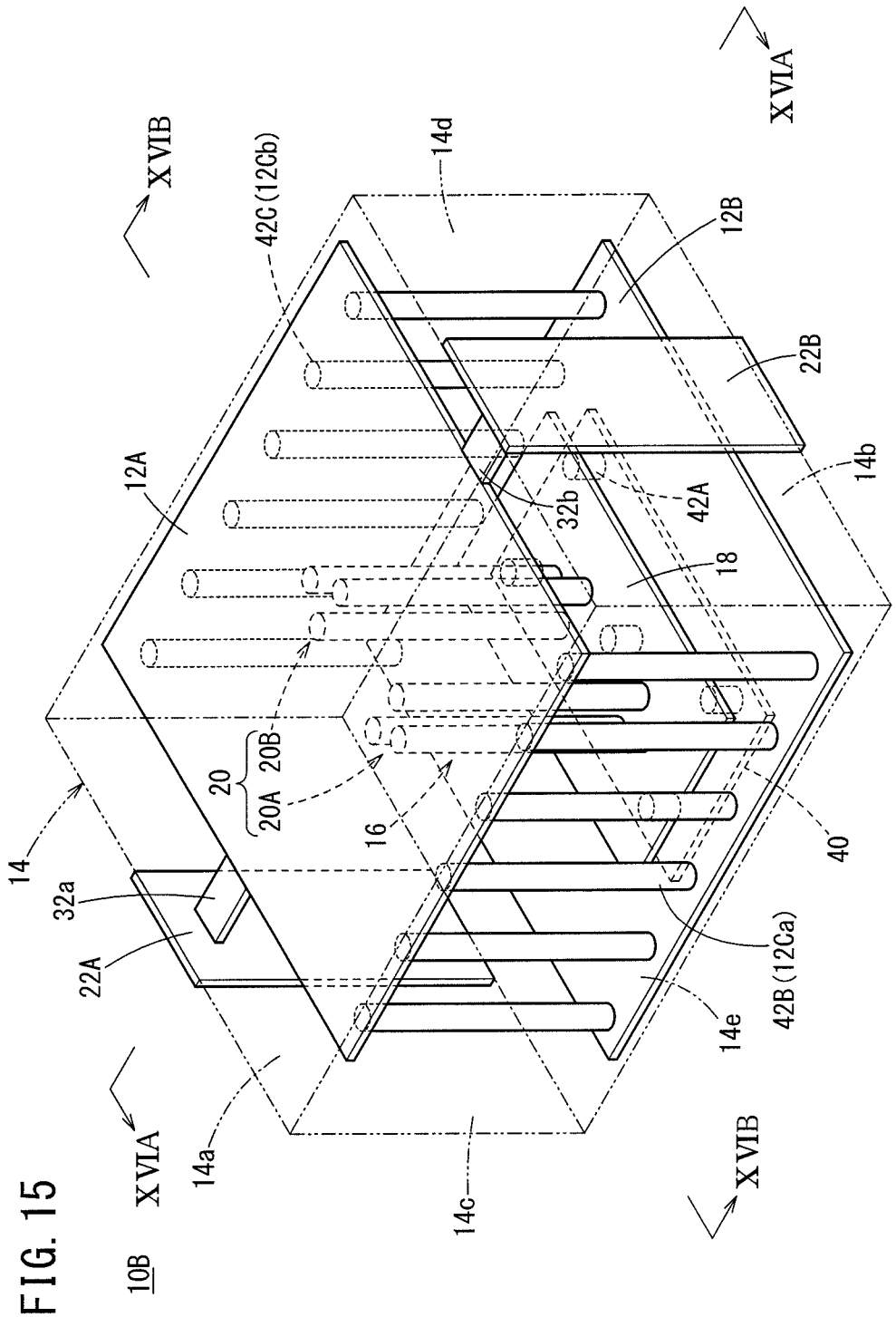
FIG. 15 is a see-through perspective view showing a resonator according to a second embodiment (a second resonator)
Figure 16A:
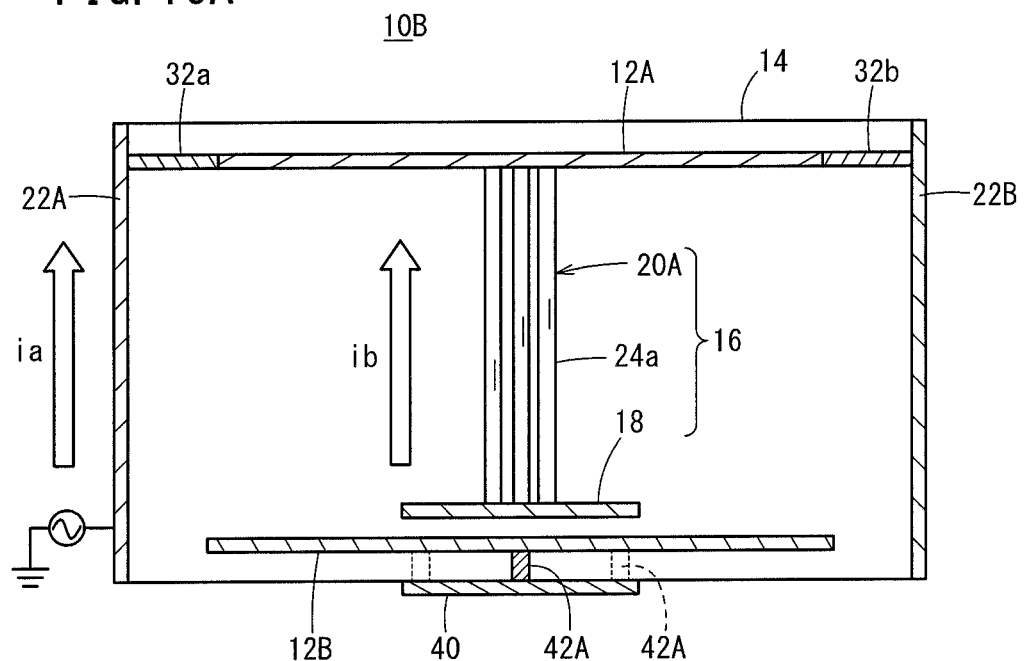
FIG. 16A is a cross-sectional view taken along the line XVIA-XVIA in FIG. 15.
Figure 16B:
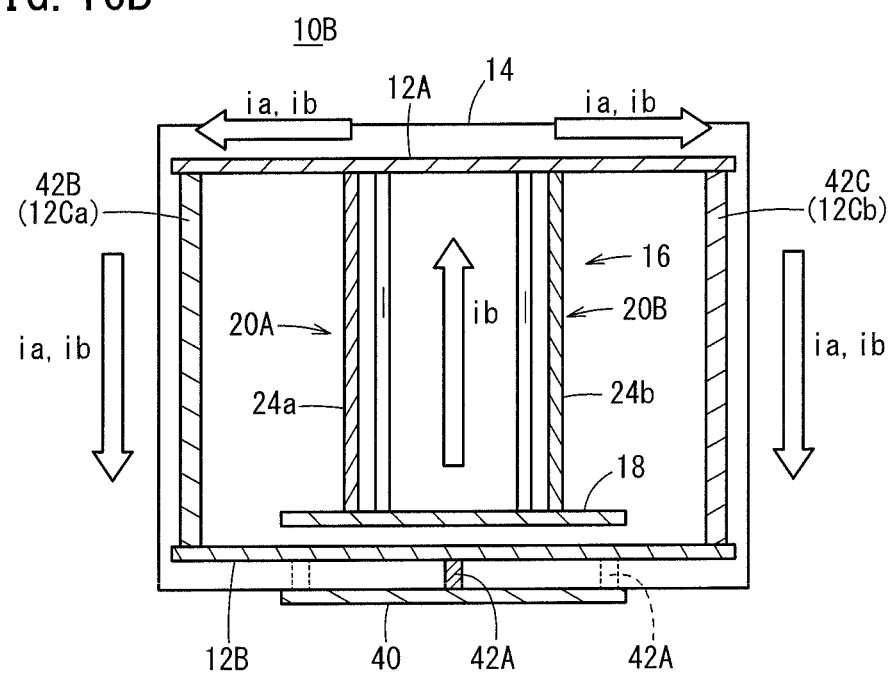
FIG. 16B is a cross-sectional view taken along the line XVIB-XVIB in FIG. 15.

The second resonator 10B has a configuration substantially similar to that of the above-mentioned first resonator 10A, but differs in the following points, as shown in FIGS. 15-16B.

(a-1) An external terminal 40 supplied with a constant potential (for example, a ground potential) is formed on a lower surface 14e of the dielectric substrate 14.

(a-2) The lower shielding conductor 12B is formed in the dielectric substrate 14.

(a-3) The lower shielding conductor 12B and the external terminal 40 are electrically connected via a first via hole 42A.

(a-4) A plurality of (for example, six) second via holes 42B that electrically connect the upper shielding conductor 12A and the lower shielding conductor 12B are formed along the third side surface 14c in a portion inside the dielectric substrate 14, the portion being adjacent to the third side surface 14c. That is, the plurality of second via holes 42B functioning as the first side surface shielding conductor 12Ca are formed.

(a-5) A plurality of (for example, six) third via holes 42C that electrically connect the upper shielding conductor 12A and the lower shielding conductor 12B are formed along the fourth side surface 14d in a portion inside the dielectric substrate 14, the portion being adjacent to the fourth side surface 14d. That is, the plurality of third via holes 42C functioning as the second side surface shielding conductor 12Cb are formed.

In the second resonator 10B, as shown in FIGS. 15, 16A, and 16B, by the first input/output terminal 22A being supplied with the current ia in, for example, the positive direction, the current ia diffuses in the upper shielding conductor 12A, and flows toward the second via hole 42B and the third via hole 42C. At that time, the displacement current ib flows also from the strip line 18 toward the upper shielding conductor 12A via the via electrode section 20, and this displacement current ib also flows toward the second via hole 42B and the third via hole 42C via the upper shielding conductor 12A. That is, from the instant that the first input/output terminal 22A has been supplied with the current ia in, for example, the positive direction, the current (the current ia and the current ib) flows, while diffusing from the upper shielding conductor 12A into the second via hole 42B and the third via hole 42C. As a result, an improvement in the Q-factor can be achieved without increasing the size of the via electrode section 20.

In particular, because this second resonator 10B can be mounted by performing side surface mounting on the first input/output terminal 22A and the second input/output terminal 22B, and flip-chip mounting on the external terminal 40 formed on the lower surface 14e of the dielectric substrate 14, the second resonator 10B enables higher density mounting to be achieved than the first resonator 10A does.

Next, a resonator according to a third embodiment (hereafter, written as a third resonator 10C) will be described with reference to FIGS. 17-18B.

Figure 17:
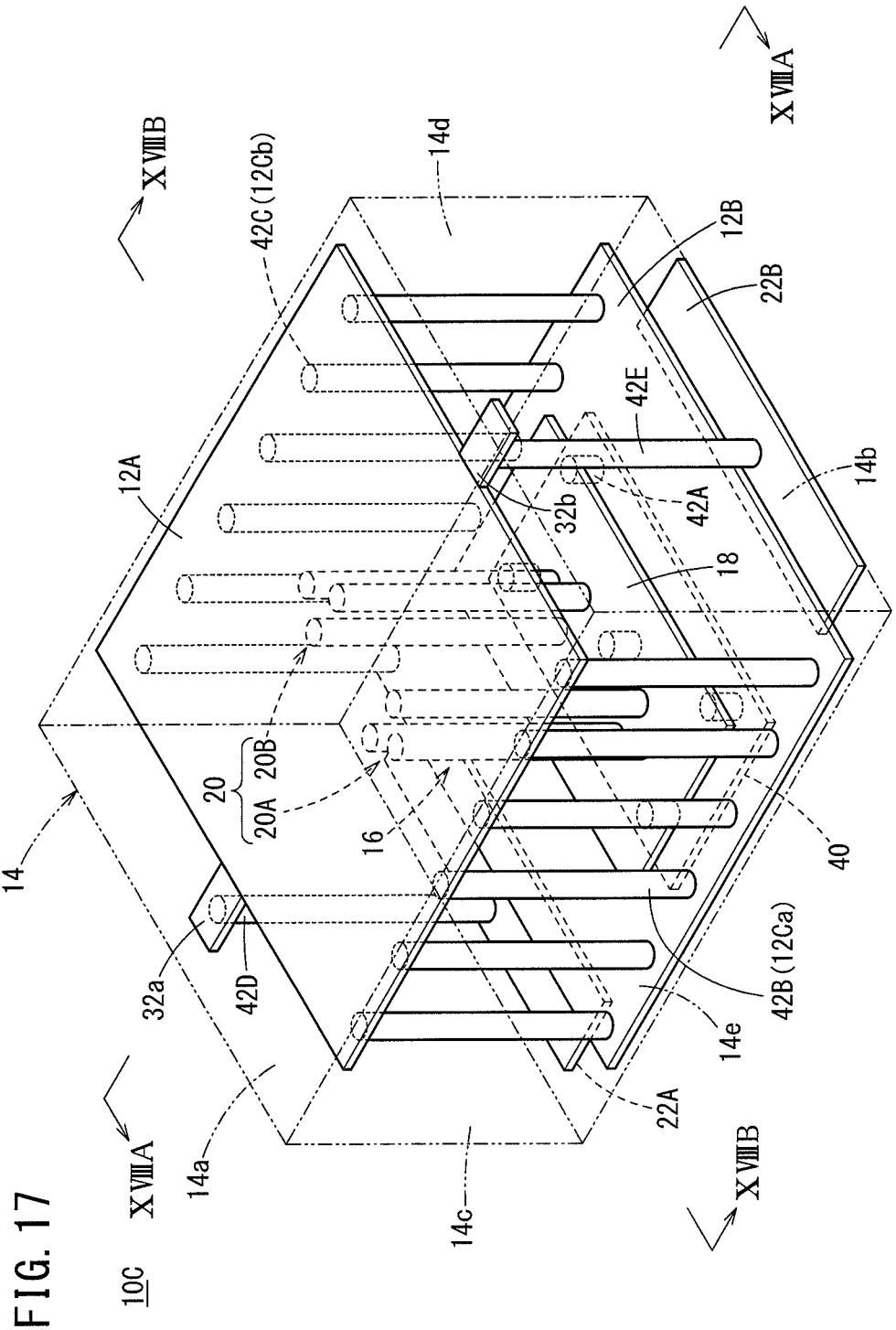
FIG. 17 is a see-through perspective view showing a resonator according to a third embodiment (a third resonator)
Figure 18A:
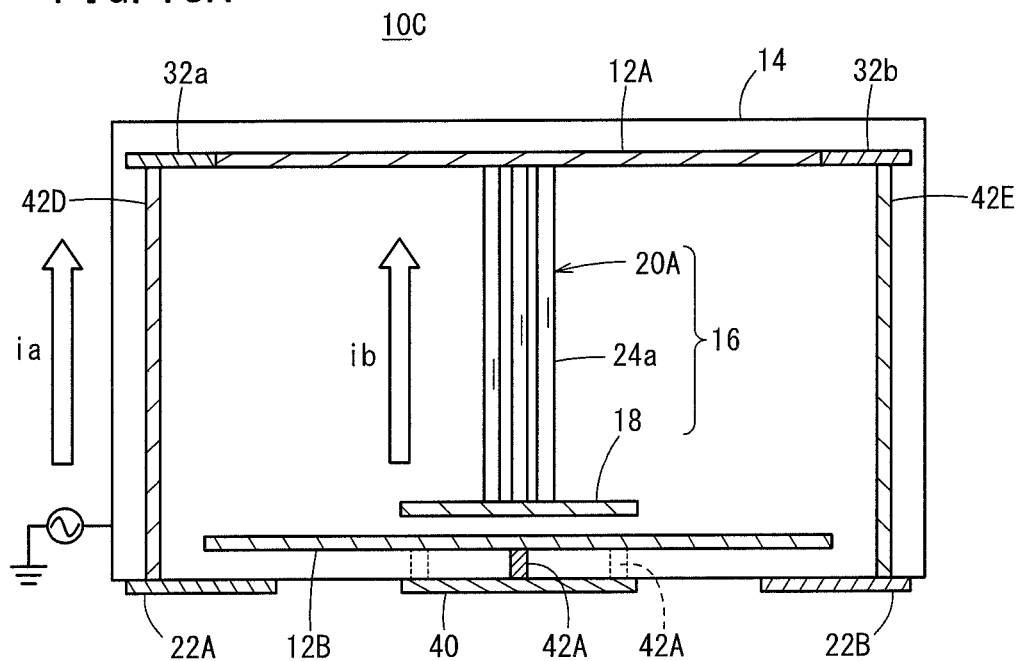
FIG. 18A is a cross-sectional view taken along the line XVIIIA-XVIIIA in FIG. 17.
Figure 18B:
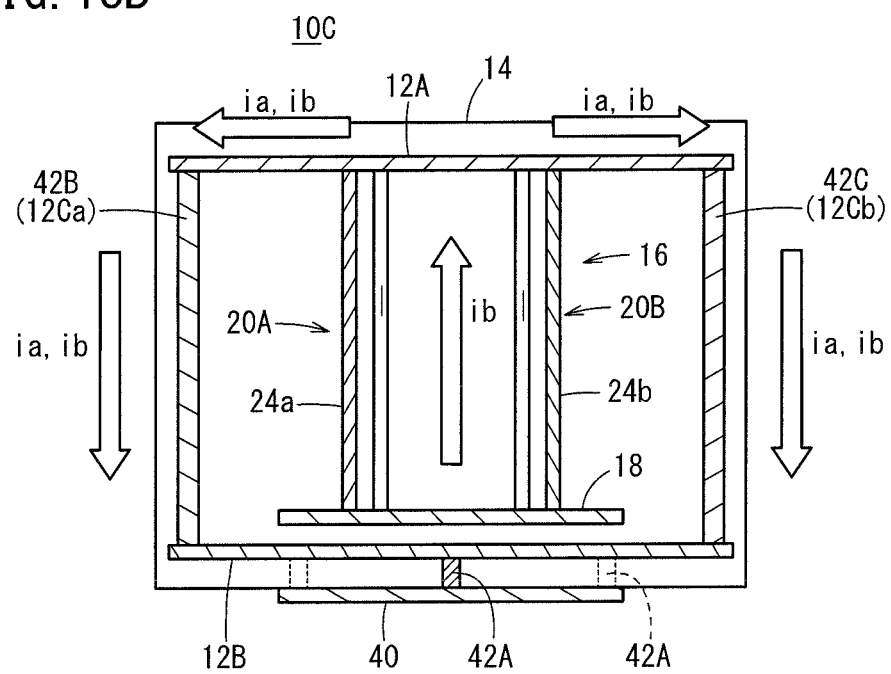
FIG. 18B is a cross-sectional view taken along the line XVIIIB-XVIIIB in FIG. 17.

The third resonator 10C has a configuration substantially similar to that of the above-mentioned second resonator 10B, but differs in the following points, as shown in FIGS. 17-18B.

(b-1) The first input/output terminal 22A and the second input/output terminal 22B are not formed on side surfaces of the dielectric substrate 14.

(b-2) The first input/output terminal 22A is formed in a position facing the first connection line 32a of the upper shielding conductor 12A, on the lower surface 14e of the dielectric substrate 14.

(b-3) The first connection line 32a and the first input/output terminal 22A are electrically connected via a fourth via hole 42D.

(b-4) The second input/output terminal 22B is formed in a position facing the second connection line 32b of the upper shielding conductor 12A, on the lower surface 14e of the dielectric substrate 14.

(b-5) The second connection line 32b and the second input/output terminal 22B are electrically connected via a fifth via hole 42E.

In the third resonator 10C, as shown in FIGS. 17, 18A, and 18B, by the first input/output terminal 22A formed on the lower surface 14e of the dielectric substrate 14 being supplied with the current ia in, for example, the positive direction, the current ia diffuses in the upper shielding conductor 12A via the fourth via hole 42D, and flows toward the second via hole 42B and the third via hole 42C. At that time, the displacement current ib flows also from the strip line 18 toward the upper shielding conductor 12A via the via electrode section 20, and this displacement current ib also flows toward the second via hole 42B and the third via hole 42C via the upper shielding conductor 12A. That is, from the instant that the first input/output terminal 22A has been supplied with the current is in, for example, the positive direction, the current (the current ia and the current ib) flows, while diffusing from the upper shielding conductor 12A into the second via hole 42B and the third via hole 42C. As a result, an improvement in the Q-factor can be achieved without increasing the size of the via electrode section 20.

In particular, because this third resonator 10C can be mounted by performing flip-chip mounting not only on the external terminal 40 formed on the lower surface 14e of the dielectric substrate 14 but also on the first input/output terminal 22A and the second input/output terminal 22B, the third resonator 10C enables higher density mounting to be achieved than the second resonator 10B does.

Note that the resonator according to the present invention is not limited to those in the above-mentioned embodiments, and a variety of configurations may of course be adopted without departing from the spirit of the present invention.

REFERENCE SIGNS LIST

10A to 10C: first resonator to third resonator
12A: upper shielding conductor
12B: lower shielding conductor
12Ca: first side surface shielding conductor
12Cb: second side surface shielding conductor
14: dielectric substrate
16: structure
18: strip line
20: via electrode section
20A: first via electrode section
20B: second via electrode section
22A: first input/output terminal
22B: second input/output terminal
24a: first small-diameter via electrode
24b: second small-diameter via electrode
26a: first curved line
26b: second curved line
28: region
30: pattern (line)
32a: first connection line
32b: second connection line
34A: first λ/4 resonator
34B: second λ/4 resonator
40A: first input/output line
40B: second input/output line
42A to 42E: first via hole to fifth via hole

The invention claimed is:

1. A resonator comprising:
a via electrode section formed in a dielectric substrate;
a plurality of shielding conductors formed in or on the dielectric substrate so as to surround the via electrode section;
a plurality of input/output terminals formed at least on two surfaces of the dielectric substrate; and
a strip line connected to the via electrode section, which has a short-circuit end connected to a first shielding conductor, and facing at least a second shielding conductor in the dielectric substrate, wherein
the strip line is not directly connected to the plurality of shielding conductors and the plurality of input/output terminals;
the plurality of input/output terminals are electrically connected to the first shielding conductor to which the short-circuit end of the via electrode section is connected, among the plurality of shielding conductors.

2. The resonator according to claim 1, wherein
the plurality of shielding conductors include:
the first shielding conductor formed on a first principal surface side of the dielectric substrate;
the second shielding conductor formed on a second principal surface side of the dielectric substrate;
a third shielding conductor formed on a first side surface side of the dielectric substrate; and
a fourth shielding conductor formed on a second side surface side of the dielectric substrate, and
the short-circuit end of the via electrode section, a first input/output terminal, and a second input/output terminal are connected to the first shielding conductor.

3. A resonator comprising:
a via electrode section formed in a dielectric substrate;
a plurality of shielding conductors formed in or on the dielectric substrate so as to surround the via electrode section; and
a strip line connected to the via electrode section, which has a short-circuit end connected to a first shielding conductor, and facing at least a second shielding conductor in the dielectric substrate, wherein
a first input/output terminal and a second input/output terminal are connected to the first shielding conductor to which the short-circuit end of the via electrode section is connected, among the plurality of shielding conductors, the via electrode section includes a first via electrode section and a second via electrode section that are formed adjacently to each other, the first via electrode section is configured from a plurality of first via electrodes, the second via electrode section is configured from a plurality of second via electrodes, no other via electrode section exists between the first via electrode section and the second via electrode section, the plurality of first via electrodes are arranged along an imaginary first curved line when viewed from above, and the plurality of second via electrodes are arranged along an imaginary second curved line when viewed from above.

4. The resonator according to claim 3, wherein
the first curved line and the second curved line configure a part of an outline of a single ellipse or a part of an outline of a single track shape.

5. The resonator according to claim 3, wherein
the first via electrode section, together with the strip line, configures a first $\lambda/4$ resonator, and the second via electrode section, together with the strip line, configures a second $\lambda/4$ resonator.

6. The resonator according to claim 3, wherein
when an interval between the first via electrode section and the second via electrode section is represented as dv, and a length of the dielectric substrate along a longitudinal direction of the strip line is represented as La, dv/La≤0.25 is satisfied.

\* \* \* \* \*